United States Patent [19]

Nakayama et al.

[11] Patent Number: 5,903,745
[45] Date of Patent: May 11, 1999

[54] TIMING GENERATOR FOR PLURAL REFERENCE CLOCKS

[75] Inventors: Hiroyasu Nakayama, Kumagayashi; Masayuki Itoh, Kazo, both of Japan

[73] Assignee: Advantest Corp., Tokyo, Japan

[21] Appl. No.: 08/620,102

[22] Filed: Mar. 21, 1996

[51] Int. Cl.⁶ .................................................... G06F 1/04
[52] U.S. Cl. ........................................ 395/555; 395/557
[58] Field of Search ................................... 395/555, 557, 395/183.01, 183.16; 371/22.1–27; 364/489–491

[56] References Cited

U.S. PATENT DOCUMENTS

| | | | |
|---|---|---|---|
| 3,810,121 | 5/1974 | Chang et al. | 395/553 |
| 4,191,998 | 3/1980 | Carmody | 395/555 |
| 4,775,954 | 10/1988 | Fujieda et al. | 371/27 X |
| 5,359,727 | 10/1994 | Kurita et al. | 395/555 X |
| 5,430,737 | 7/1995 | Yamashita et al. | 371/25.1 |
| 5,442,642 | 8/1995 | Ingalls et al. | 371/22.5 |
| 5,553,276 | 9/1996 | Dean | 395/555 |
| 5,590,137 | 12/1996 | Yamashita | 371/27 |

Primary Examiner—Thomas M. Heckler
Attorney, Agent, or Firm—Muramatsu & Associates

[57] ABSTRACT

A timing generator compensates the difference between the reference clock frequencies by converting the base number for generating the timing signals corresponding to the ratio of reference clock frequencies. The timing generator includes: a data memory for dynamically receiving the timing data through the software process to determine the time length of the timing signals where the timing data is formed of a quotient produced by a division of the time length by a time period of a reference clock and a fraction which is a remainder of said division; a counter for counting the number of pulses of a reference clock signal and generating an output signal when the number of counts of the pulse coincides with the quotient; an accumulator for accumulating the fraction data with the fraction data of previous cycle of the reference clock signal and generating a carry signal when the accumulated value exceeds the time period of the reference clock signal; a number converter which converts the timing data provided through the software process based on a first reference clock period Tn by a ratio of the first reference clock period Tn and a second clock period Tm; and means for providing a complementary number -Tm of the second reference clock period Tm to the accumulator.

5 Claims, 21 Drawing Sheets

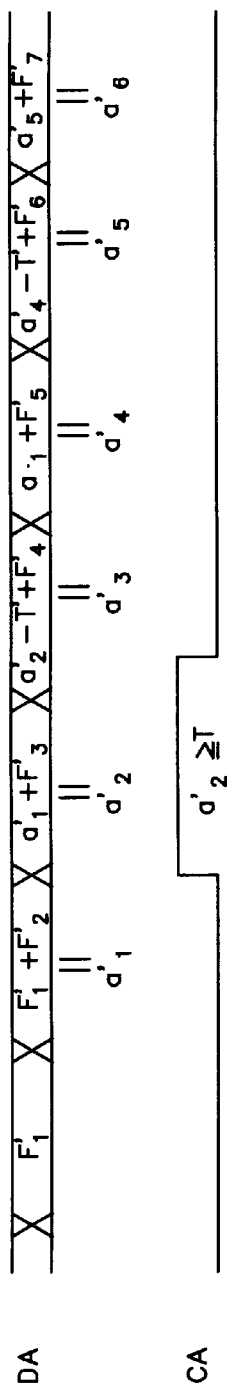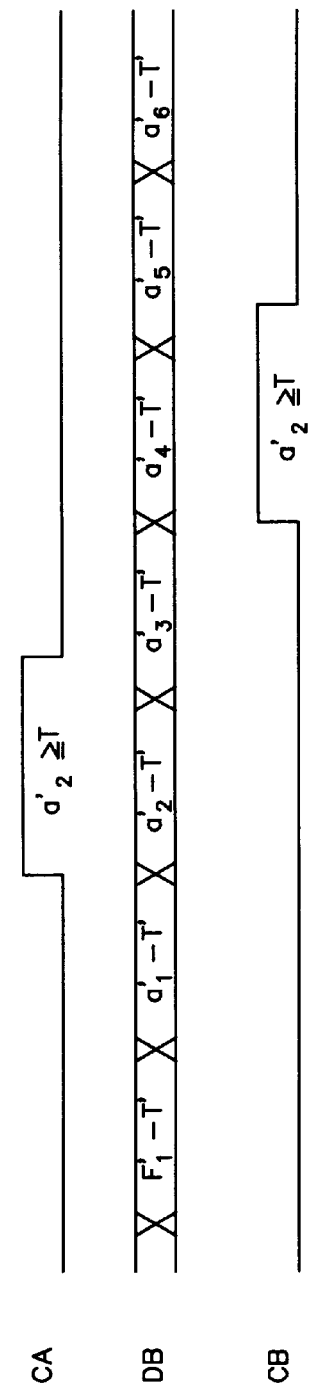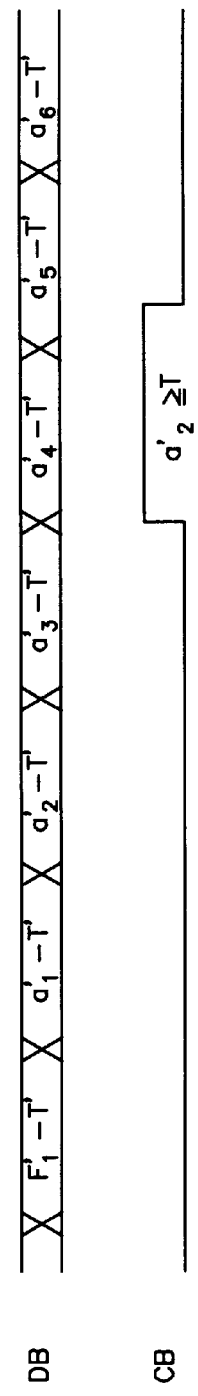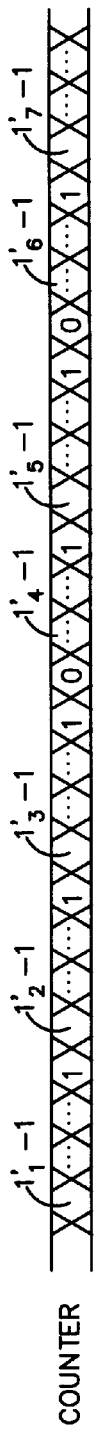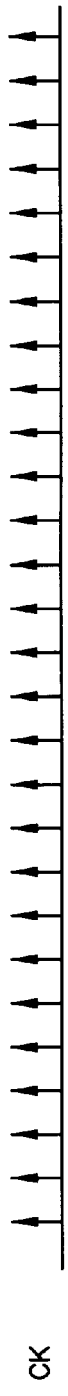

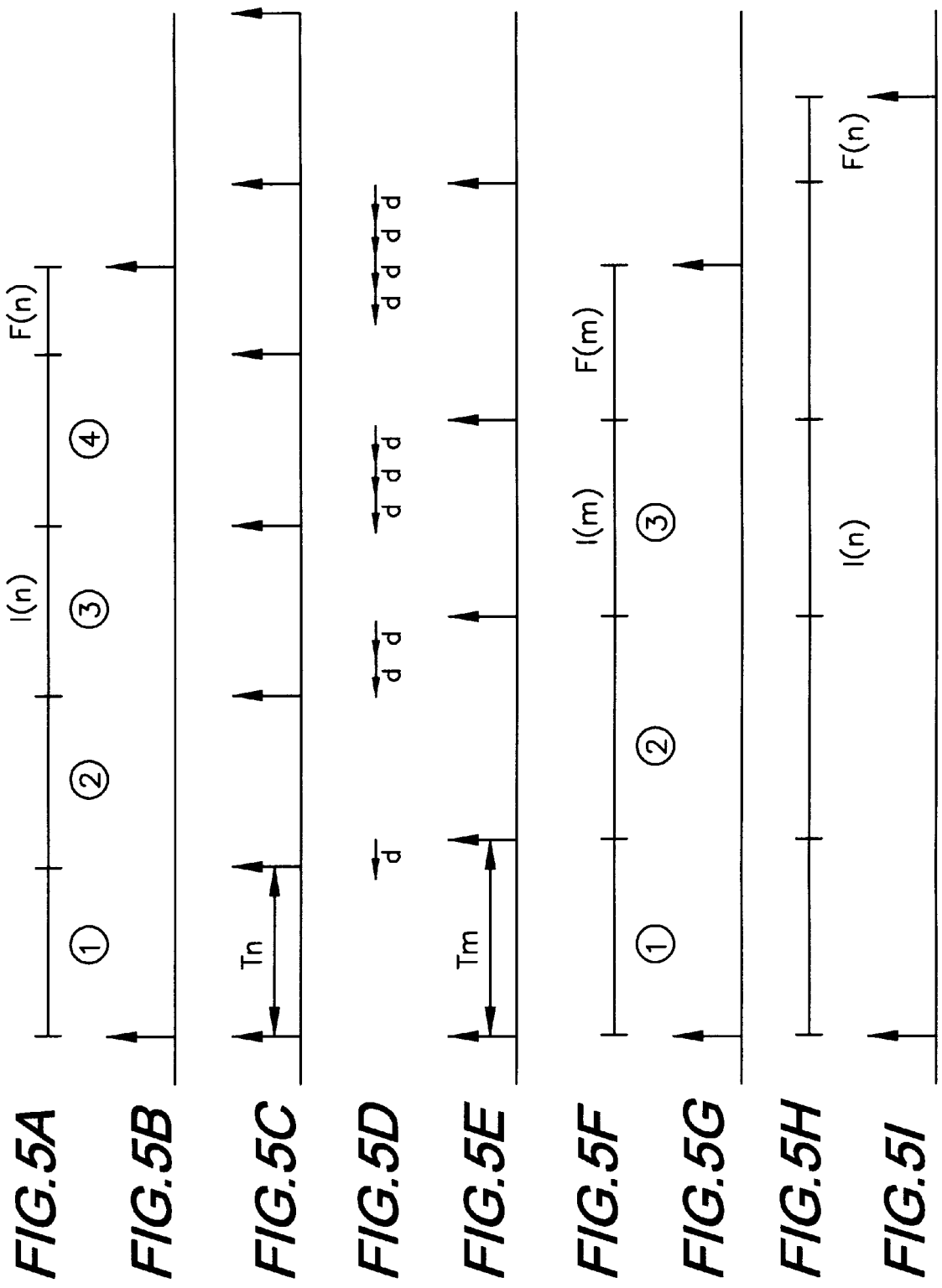

FIG. 6A MCLK

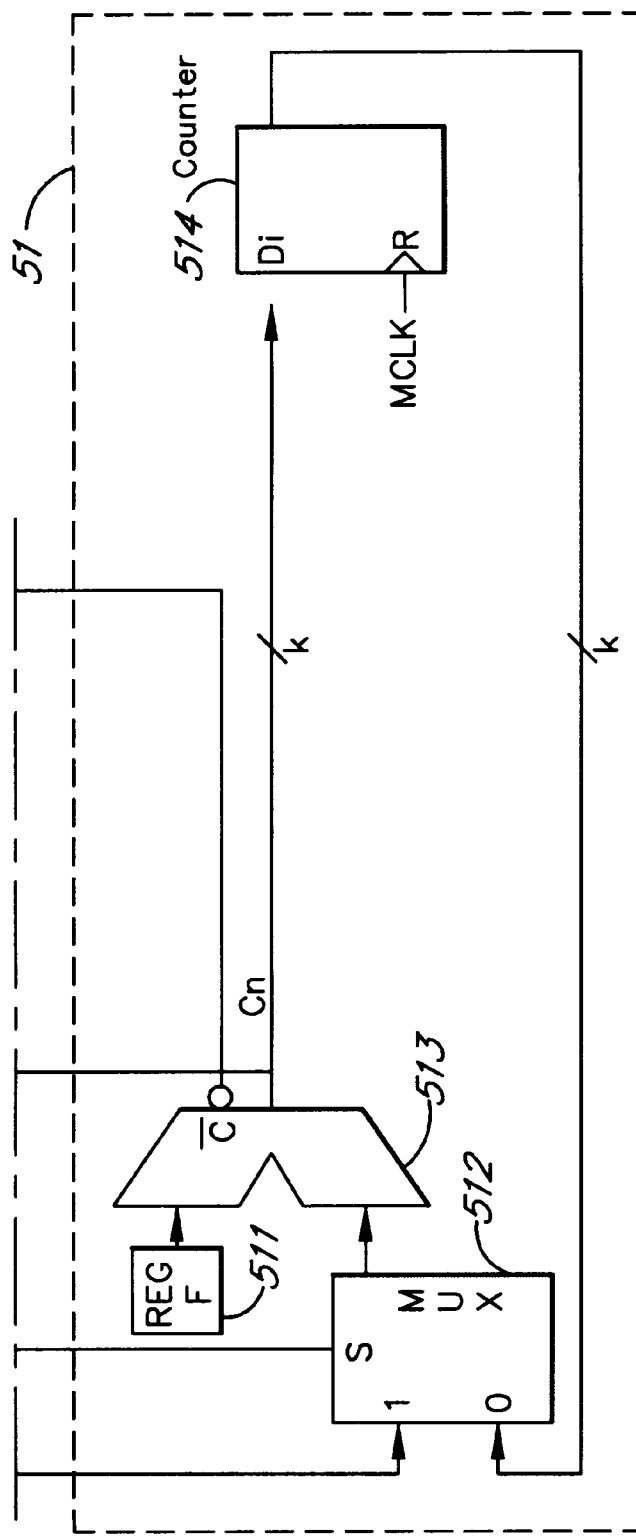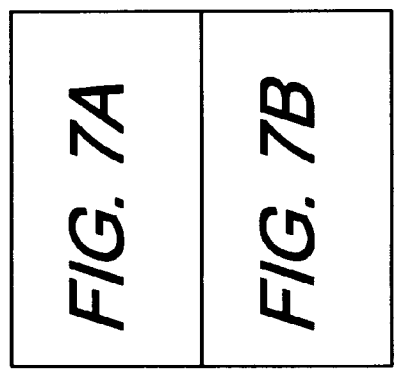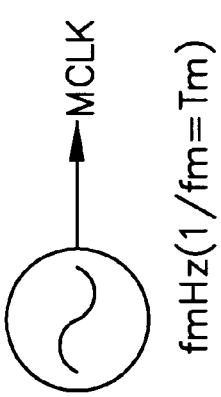
FIG. 7

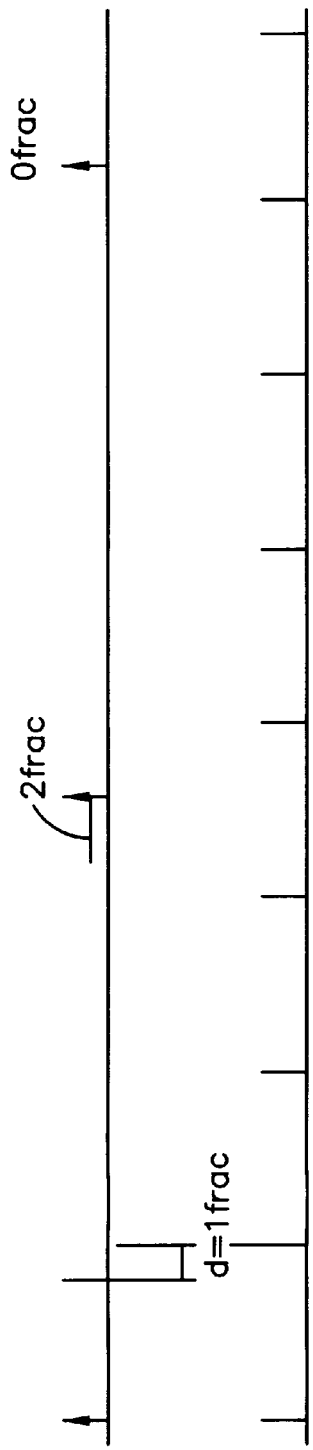
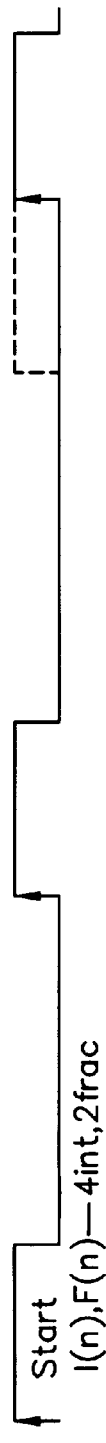
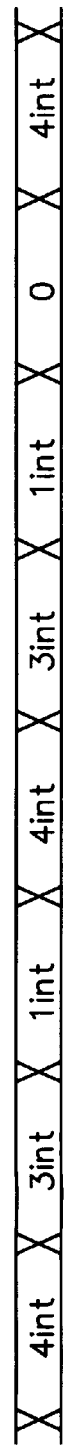

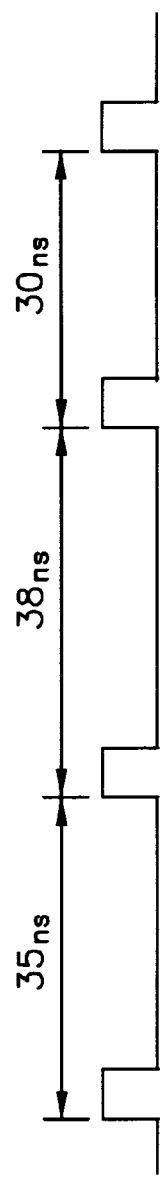
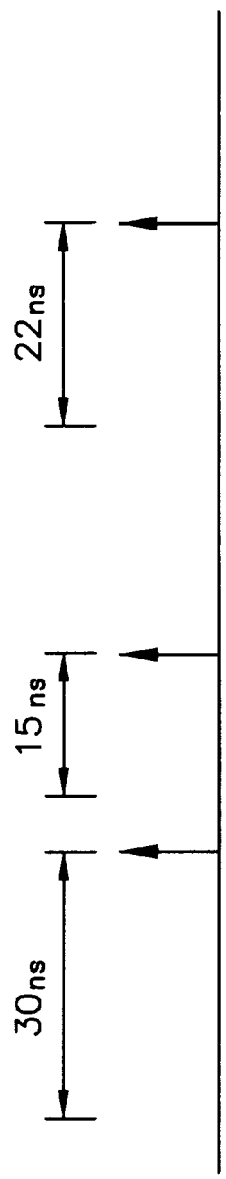
*(Prior Art)*
FIG. 11A CLK1
FIG. 11B CLK2
FIG. 11C STRB

| ADDRESS | #0 | #1 | #2 |
|---|---|---|---|
| RATE MEMORY | 35ns | 38ns | 30ns |
| Tmg MEMORY 1 (CLK1) | 0ns | 0ns | 0ns |
| Tmg MEMORY 2 (CLK2) | 7ns | 5ns | 8ns |
| Tmg MEMORY 3 (STRB) | 30ns | 15ns | 22ns |

*FIG. 12 (Prior Art)*

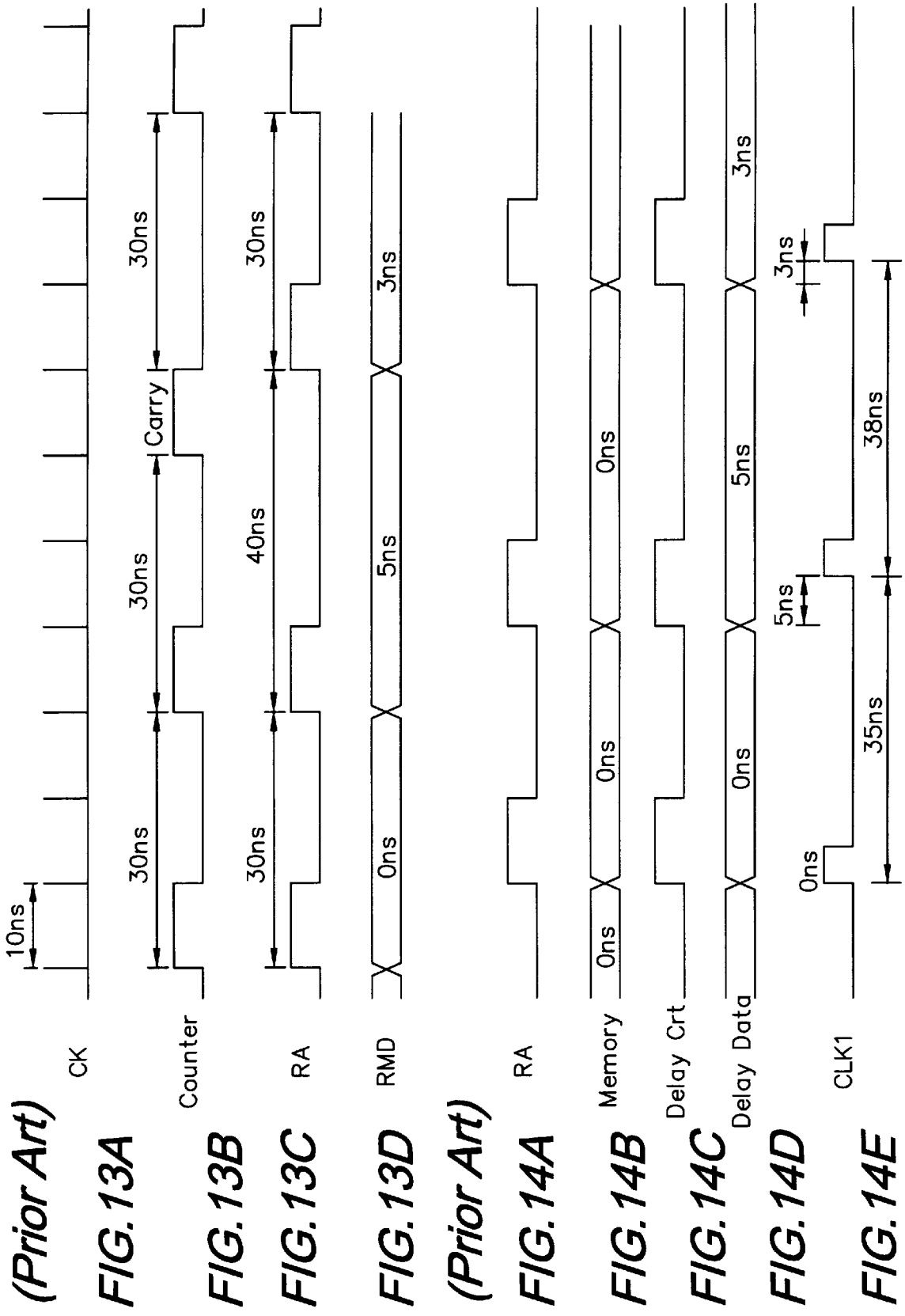

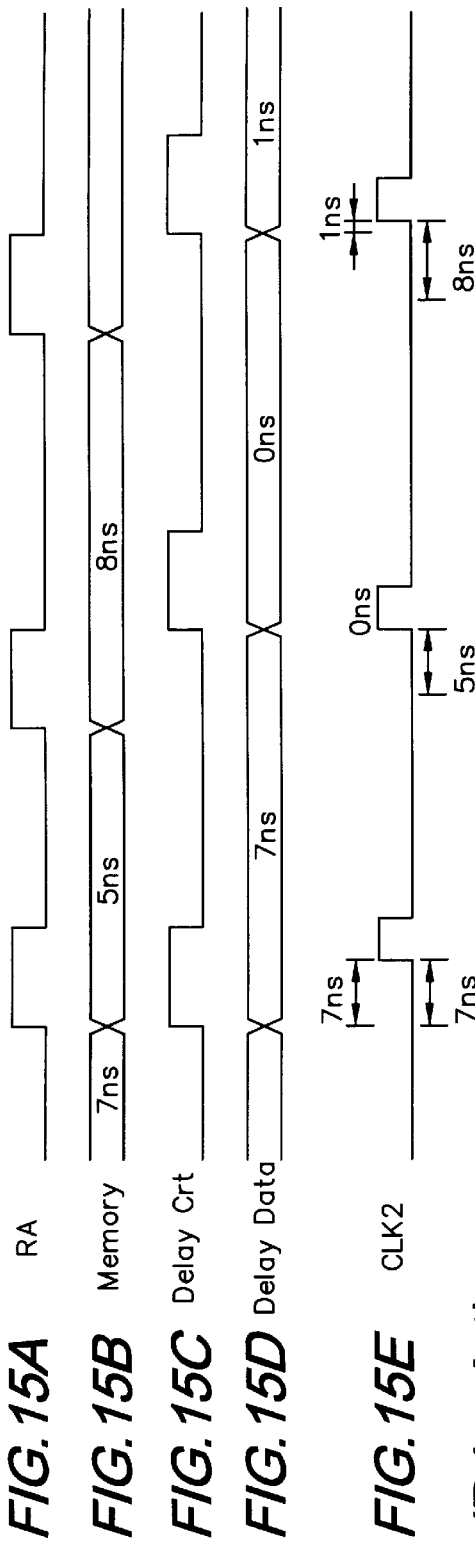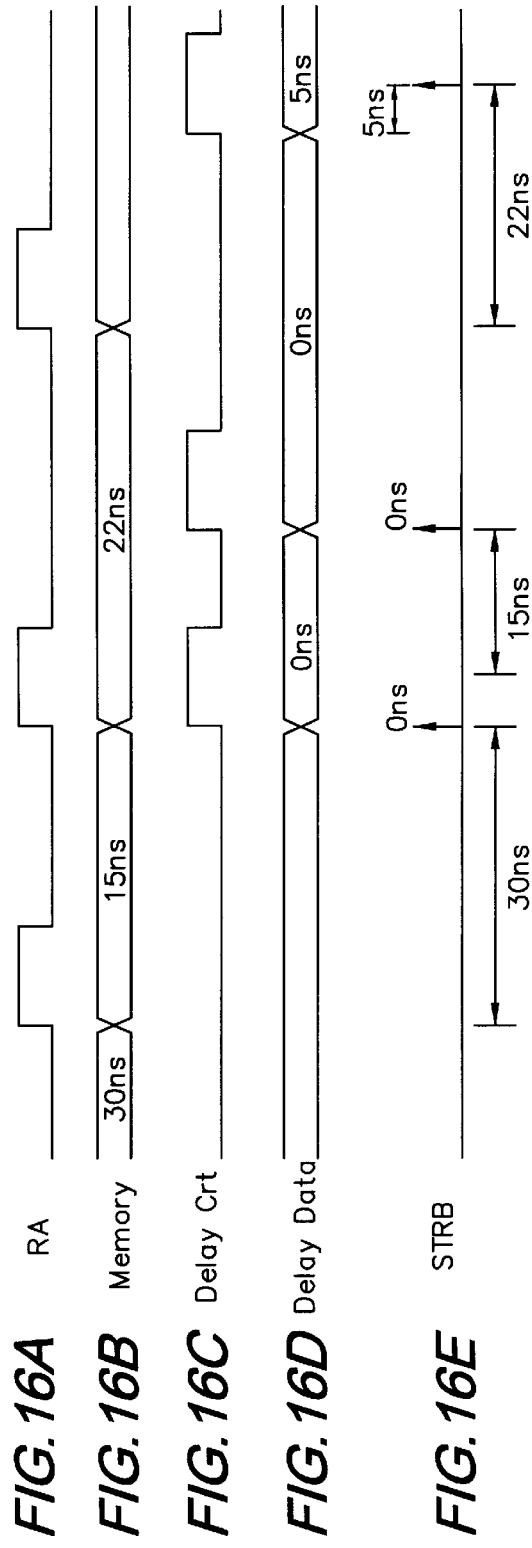

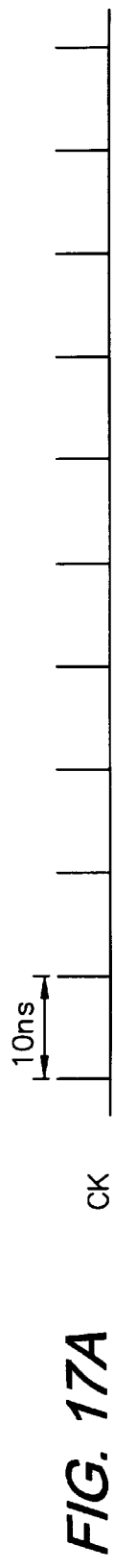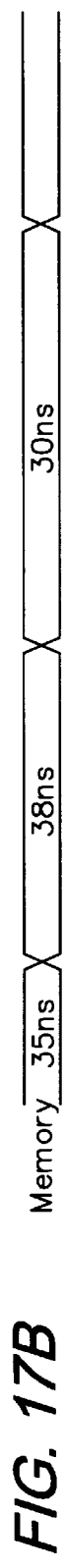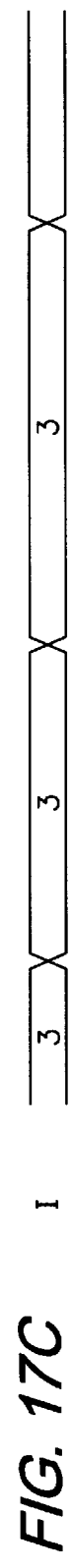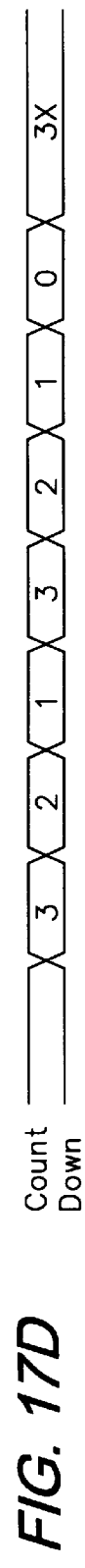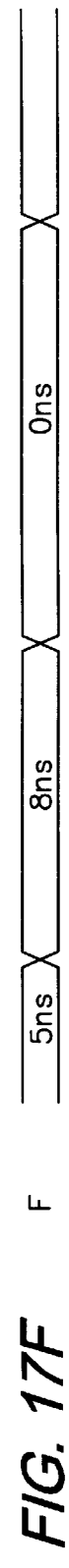
(Prior Art)
FIG. 17A
FIG. 17B
FIG. 17C
FIG. 17D
FIG. 17E
FIG. 17F

*(Prior Art)*

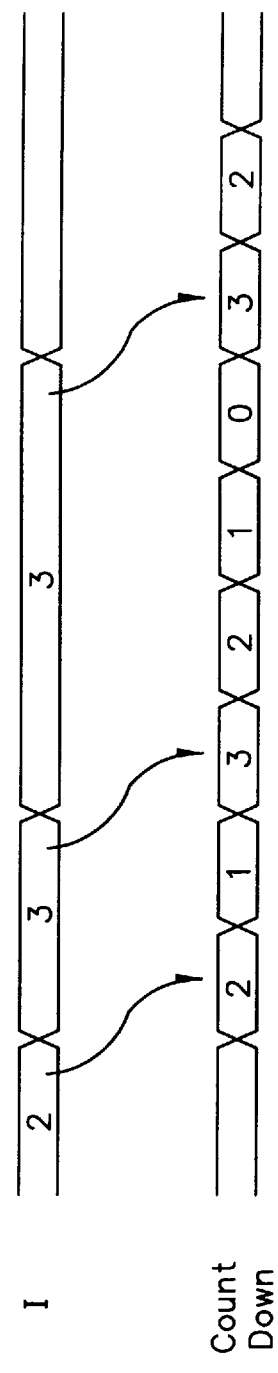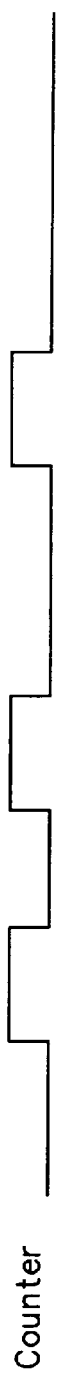
FIG. 19A CK
FIG. 19B Memory
FIG. 19C I
FIG. 19D Count Down
FIG. 19E Counter
FIG. 19F F

FIG. 19G  Acc Out
FIG. 19H  Register
FIG. 19I  Register
FIG. 19J  RA
FIG. 19K  RMD

TIMING GENERATOR FOR PLURAL REFERENCE CLOCKS

FIELD OF THE INVENTION

This invention relates to a timing generator for determining timings in a semiconductor test system, and more particularly, to a timing generator to generate predetermined timings without changing timing data when a frequency of a reference clock oscillator has been changed.

BACKGROUND OF THE INVENTION

In testing semiconductor IC devices by a semiconductor test system, such as an IC tester, the semiconductor IC device to be tested is provided with test signals for appropriate pins at a predetermined test timing, i.e., a tester rate. The IC tester receives output signals from the IC device under test generated in response to the test signals. The output signals are strobed, i.e., sampled, with reference to the tester rate, at predetermined delay timings to be compared with expected data to determine whether the semiconductor device functions correctly.

The timing signals for forming the tester rate and the delay times are basically generated by a highly stabilized reference clock oscillator such as a crystal oscillator. When the required timing resolution in an IC tester is equal to or an integer multiple of the shortest clock rate (a time period) of a reference clock oscillator, timing signals can be generated by simply dividing the reference clock by a counter and synchronizing the divided output with the reference clock.

However, a modern IC tester requires a higher timing resolution than the shortest clock rate (time period of one clock cycle) of the reference clock oscillator. For example, in case where a clock rate of a reference clock oscillator is 10 ns (nanosecond), the IC tester may require a tester rate of 32.5 ns and the delay timing of 6.2 ns from the start of test cycle. Furthermore, the modern IC tester dynamically changes such timings in a cycle by cycle basis based on a program, i.e., a software process.

To generate such timing signals of a timing resolution higher than the clock rate, it is known in the prior art that a combination of a counter and an accumulator can be used to form such timing signals while dynamically generating interpolation data based on a software program.

FIG. 10 is a block diagram showing an example of conventional semiconductor test system with an emphasis of a timing generator having the combinations of the counters and accumulators. The timing generator in FIG. 10 is generally formed of a rate generator 2 and a plurality of delay generators 3. A pattern generator 1 provides address data to the rate generator 2 to determine timings for each test pattern cycle. Although not shown, the pattern generator 1 also generates pattern data to determine a type of test signal and expected data to compare with resulting output signals from the device under test.

The rate generator 2 provides a tester rate RA and interpolation data RMD to the delay generator 3. The delay generator 3 provides a delay time defined by the interpolation data RMD to the tester rate RA. The delay generator 3 further provides a delay time on the basis of timing data provided in a timing memory therein. The test signal whose timing is thus determined by the delay generator 3 is wave shaped by a wave formatter 38 and is applied to a semiconductor device 4 through a pin electronics 39 which interfaces the IC tester with each pin of the IC device 4. In an actual IC tester, a large number of delay generators are prepared corresponding to input pins of an IC device to be tested.

The more detailed explanation of the conventional timing generator will be made with reference to FIGS. 10–12. The rate generator 2 includes a reference oscillator 20, a rate memory 21, an accumulator 22, registers 23 and 24, a counter 25, and a delay circuit 26. The reference oscillator 20 oscillates at a frequency $f_{hz}$, for example 100 $M_{HZ}$, which is a reference clock Ck and provides the reference clock Ck throughout the timing generator and other blocks of the IC tester. The rate memory 21 stores rate data which defines the tester rate RA for each test cycle. The rate data for the test signal is formed through a software process with various factors of surrounding circuit elements in mind.

The counter 25 receives a part of the rate data which is larger than the reference clock period T ($=1/f_{HZ}$) of the reference clock Ck. The accumulator 22 receives a part of the rate data (fractional data) F which is smaller than the reference clock period T. The accumulator 22 adds the interpolation data RMD for the previous clock Ck provided from the register 23 to the fractional data F from the rate memory 21. For example, in a case where the desired tester rate for this cycle is 32.5 nanosecond, and the reference clock period is 10 ns, the data 30 ns (or simply 3 which is an integer multiple of 10 ns) is provided to the counter 25 and the fractional data 2.5 ns is provided to the accumulator 22.

The counter 25 is, for example, a download counter which counts the number of pulses of the reference clock Ck. When the count coincides with the data from the rate memory, the counter 25 generates a coincidence signal to be received by the delay circuit 26. When the data indicating 30 nanosecond is received by the counter 25, like the example above, the counter downloads the data by counting the number of reference clock pulses and generates a coincidence signal when counting three pulses.

When the accumulated data exceeds the reference clock period T, the accumulator 21 outputs a carry signal which is provided to the delay circuit 26 through the register 24. When the accumulated data does not exceed the reference clock period T, the resulting data is further added to the fractional data F from the rate memory 21 in the next cycle of the reference clock Ck. This process of accumulation is repeated throughout the generation of the timing signals in the IC tester.

When the carry is received by the delay circuit 26, the delay circuit 26 produces a tester rate RA at the timing of the reference clock Ck coming immediately after the carry. Thus, every time the carry is generated by the accumulator, the delay circuit provides one cycle delay to the output signal from the counter 25. The tester rate RA is supplied to the delay generator 3 to initiate the operation of the delay generator 3. The tester rate RA is also provided to the pattern generator 1 to access the next address of the rate memory 21. Further, in addition to the tester rate RA, the interpolation data RMD from the register 23 is received by the delay generator 3.

A carry is not generated until the accumulated value in the accumulator 22 is less than the reference clock period T. Thus, the output of the counter 25 is transferred as the tester rate RA without an additional delay time.

The delay generator 3 has a similar structure to the rate generator 2. The delay generator 3 includes a timing memory 31, an accumulator 32, registers 33 and 34, a counter 35, a delay circuit 36 and a variable delay circuit 37. The reference clock Ck is given to these circuit elements of the delay generator 3 to synchronize operations in the IC tester. The timing memory 31 stores timing data to determine the timings such as test signals and strobe signals further to the tester rate RA and the interpolation data RMD from the rate generator 2. The timing data for the timing memory 31 is formed through a software process with various factors of surrounding circuit elements in mind.

The counter 31 receives a part of the timing data which is larger than the reference clock period T ($=1/f_{HZ}$) of the reference clock Ck in the manner same as the counter in the rate generator 2. The accumulator 32 receives a part of the timing data (fractional data) which is smaller than the reference clock period T. The accumulator 32 adds the interpolation data RMD for the previous clock Ck provided from the register 33 to the fraction data from the timing memory 21. As noted above with respect to the rate generator, in the case where the desired timing for the cycle is 32.5 ns, and the reference clock period is 10 ns, the data 30 ns is provided to the counter 35 and the fractional data 2.5 ns is provided to the accumulator 32.

The counter 35 is, for example, a download counter which counts the number of pulses of the reference clock Ck. When the counted data coincides with the data from the timing memory 31, the counter 35 generates a coincidence signal to be received by the delay circuit 36. Thus, when the data indicating 30 ns is received by the counter 36, like the example above, the counter 36 generates an output signal when counting three pulses of the reference clock CK.

When the accumulated data exceeds the reference clock period T, the accumulator 32 outputs a carry which is provided to the delay circuit 36 through the register 34. When the accumulated data does not exceed the reference clock period T, the resulting data is further added to the fractional data F from the timing memory 21 in the next reference clock Ck. This process of accumulation is repeated until the carry is generated by the accumulator within the tester rate.

When the carry is received by the delay circuit 36, the delay circuit 36 provides a delay time which is equal to one cycle of the reference clock Ck. A carry is not generated so long as the accumulated value in the accumulator 32 is less than the reference clock period T. Thus, the output of the counter 35 is transferred from the delay circuit 36 as the timing signal without additional delay time.

The output signal from the delay circuit 36 is provided with an additional delay time by the variable delay circuit 37. The delay time by the variable delay circuit 37 is determined by the sum of the fraction data from the timing memory 31 and the interpolation data RMD from the rate generator 2.

In the timing generator, a plurality of delay generators 3 are provided each of which is assigned with a corresponding test signal or a strobe signal to be used for testing the IC device. Further details of the operation of the timing generator of FIG. 10 are provided below with reference to timing charts.

Referring to FIGS. 11–13, the operation of the timing generator of FIG. 10 is explained for a case of generating a plurality of timing signals for IC testing. In this example, it is assumed that signals with timings shown FIG. 11A–11C are to be generated for testing an IC device. Test signals (clock signals as stimulus) CLK1 and CLK2 are to be supplied to the IC device while a strobe signal STRB is used for sampling the resulted output signals from the IC device. The timing relationship between the test signals CLK1, CLK2 and STRB are illustrated in FIG. 11C. In this example, it is also assumed that the time period of the reference clock Ck is 10 nanosecond.

As noted above, a plurality of delay circuits 3 are used in the timing generator. To generate these timing signals of FIG. 11, with the use of the timing generator of FIG. 10, the signal CLK1 is assigned to a delay generator 31, and the signal CLK2 is assigned to a delay generator 32, and the STRB is assigned to a delay generator 33. In this setting, each memory in the timing generator stores the timing data as shown in FIG. 12. The rate memory 21 is a memory in the rate generator 2 and the timing memories 311–313 correspond to the timing generators $3_1$–$3_3$. The address is provided to the rate memory and to the timing memories in the order of #0, #1, #2 . . . as shown in FIG. 12.

Since the signal CLK1 is a reference for the other timings in this example, the rate memory 21 is provided with the timing data of 35 ns, 38 ns and 30 ns for the addresses #0, #1 and #2. The timing memory $31_1$ for generating the signal CLK1 stores the timing data of 0 ns, 0 ns and 0 ns, respective to the addresses #0, #1, #2. The timing memory $31_2$ for generating the signal CLK2 stores the timing data of 7 ns, 5 ns, and 8 ns for the respective addresses of #0, #1, and #2. The timing memory $31_3$ for generating the strobe signal STRB stores the timing data 30 ns, 15 ns and 22 ns, respectively. As noted above, the fraction data F for the accumulator 22 in the rate generator 2 indicates 5 ns, 8 ns and 0 ns, respectively, which is differences between the integer multiple of the reference clock period 10 ns and the timing data.

FIGS. 13–17 are timing charts showing operations in the rate generator 2 and delay generators $3_1$–$3_3$ for generating the signals CLK1, CLK2 and STRB with the timings of FIG. 11. FIGS. 13A–13D are timing chart of the rate generator 2, FIGS. 14A–14E, 15A–15E, and 16A–16E are timing charts of the delay generators $3_1$–$3_3$, respectively. The rate memory 21 and the timing memories $31_1$–$31_3$ store the timing data as noted above based on the software.

As shown in FIG. 13A, the time period T of the reference clock Ck is 10 ns. The counter 25 in the rate generator 2 receives the data from the rate memory 21 and counts the reference clock Ck. The data in this case is 30 ns and thus, when counting three pulses, the counter 25 outputs a coincidence signal for every 30 ns as shown in FIG. 13B. Because the accumulator 22 generates a carry, when accumulating the fraction data 5 ns and 8 ns, the delay circuit 26 generates the tester rate RA which is one clock cycle delayed by the reference clock period T as shown in FIG. 13C. Thus, the tester rate RA in this example shows 30 ns for the test first cycle and 40 ns for the next test cycle.

The interpolation data RMD in the second cycle of FIG. 13D indicates 5 ns since the fractional data of 5 ns is provided through the accumulator 22 and the register 23 which is delayed by one cycle. In the second cycle, the next fraction data of 8 ns is accumulated by the previous RMD of 5 ns which is returned from the register 23. Thus, the accumulator 22 generates the carry indicating 10 ns as noted above, and the remainder data of 3 ns is provided as the interpolation data RMD at the output of the register 23. In this manner, the interpolation data RMD is dynamically changed by the accumulator 22 based on the fractional data in the rate memory 21.

The tester rate RA is received by the delay generator 31 through the counter 35 as shown in FIG. 14A. As noted above with reference to FIG. 12, the timing memory $31_1$ stores the timing data indicating 0 ns, 0 ns and 0 ns for the respective three cycles as shown in FIG. 14B. There is no carry signal is generated by the accumulator 32, because the accumulation of the timing data and the interpolation data RMD in this situation will not exceed the reference clock period 10 ns. Thus, the delay circuit 36 outputs a signal having the same timing relationship as the tester rate received by the counter 35 as shown in FIG. 14C.

The output of the delay circuit 36 is received by the variable delay circuit 37 which is controlled by delay data from the register 33. Since the timing data stored in the timing memory 31 is 0 ns as above, the output of the accumulator 32 is unchanged from the interpolation data RMD, which is transferred to the register 33 in the next clock cycle. Therefore, the delay data from the register 33 shown FIG. 14D which is the same data as the interpolation data RMD.

The variable delay circuit 37 provides a high resolution delay time based on the delay data from the register 33 to the output of the delay circuit 36. For the first test cycle, the delay time 5 ns is added to the second pulse, and for the second test cycle, the delay time 3 ns is added to the third pulse. As a result, the test signal CLK1 as shown in FIG. 14E is generated by the delay generator $3_1$.

In a similar manner, the tester rate RA is received by the delay generator $3_2$ through the counter 35 as shown in FIG. 15A. As noted with reference to FIG. 12, the timing memory $31_2$ stores the timing data indicating 7 ns, 5 ns and 8 ns for the respective three cycles as shown in FIG. 15B. A carry signal is not generated by the accumulator 32 for the first test cycle since accumulation of the RMD data 0 ns and the timing data 7 ns does not exceed the reference clock period 10 ns. Thus, the accumulator 32 provides the delay data to the register 33 as the present form. The register 33 transfers the data indicating 7 ns to the variable delay circuit in synchronism with the next reference clock Ck as shown in FIG. 15D.

In the second cycle, since the accumulation of the timing data 5 ns and the interpolation data RMD of 5 ns results in 10 ns, the accumulator 32 produces a carry which is supplied to the delay circuit 36 through the register 34. Thus, second pulse from the delay circuit 36 is delayed by one clock cycle, as shown in FIG. 15C. The delay data from the register 33 indicates 0 ns as shown in FIG. 15D, which is supplied to the variable delay circuit 37.

Similarly, in the next test cycle, the timing data of 8 ns and the RMD 3 ns are added which exceeds the reference clock period 10 ns. Thus, carry is generated which again delays the third pulse from the delay circuit 36 by one clock cycle. The delay data from the register 33 indicates ins which is a difference between 11 ns (8 ns plus 3 ns) and the reference clock period 10 ns, and is provided to the variable delay circuit 37 as shown in FIG. 15D.

The output of the delay circuit 36 is received by the variable delay circuit 37 which is controlled by delay data from the register 33. Since the delay data from the register 33 is 7 ns in the first test cycle, the delay time 7 ns is added to the first pulse from the delay circuit 36 which results in the first pulse of the test signal CLK2 of FIG. 15E. For the next pulse, the delay time is 0 ns. For the third pulse, the delay time ins is added by the variable delay circuit 37. Thus, the test signal CLK2 is generated as shown in FIG. 15E.

Regarding the strobe signal STRB, the tester rate RA is received by the delay generator 32 through the counter 35 as shown in FIG. 16A. As noted above with reference to FIG. 12, the timing memory $31_3$ stores the timing data indicating 30 ns, 15 ns and 22 ns for the respective three cycles as shown in FIG. 16B. Since the timing data of 30 ns is greater than the reference clock period 10 ns, the data 30 ns is given to the counter 35 which down counts the number of reference clock Ck.

Thus, the output of the counter 35 is delayed by 30 ns for the first pulse which is transferred at the output of the delay circuit 36 as shown in FIG. 16C. For the second pulse, the timing data of 10 ns is provided to the counter 35 while the fraction data of 5 ns is provided to the accumulator 22. Thus, the counter 35 generates its output signal which is delayed by 10 ns from the second pulse of tester rate RA. The fraction data 5 ns is accumulated with the RMD data 5 ns by the accumulator 32 which produces a carry signal. The carry from the register 34 further causes one cycle delay in the delay circuit 36 as shown in FIG. 16C.

For the third pulse, the timing data 20 ns is provided to the counter 35 and the fraction data 2 ns is provided to the accumulator 22. Thus, the third pulse from the delay circuit 36 is delayed by 20 ns and the delay data which is the sum of the RMD data 3 ns and the fraction data 2 ns is produced at the output of the register 33 as shown in FIG. 16D. The strobe signal STRB is generated by combining the delay time from the register 33 to the output signal from the delay circuit 36 as shown in FIG. 16E.

FIG. 17 is a timing chart showing the more details of the operation of the rate generator 2 many aspects of which are the same as that shown in the timing chart of FIG. 13. The reference clock Ck in FIG. 17A has the time period of 10 ns. The rate memory 21 stores the rate data 35 ns, 38 ns and 30 ns for the first three test cycles as shown in FIG. 17B which is also listed in FIG. 12. The rate memory 21 stores the rate data 35 ns, 38 ns and 30 ns for the first three cycle in FIG. 17B and the counter 25 is provided with data indicating 30 ns or three counts for each test cycle as in FIG. 17C. Thus, the counter 25 down counts the reference clock Ck in FIG. 17D and generates the coincidence signal for every 30 ns as in FIG. 17E.

The fraction data F in this situation is 5 ns, 8 ns, and 0 ns as in FIG. 17F which is applied to the accumulator 22 from the rate memory 21. In the first test cycle, since the fraction data is less than the reference time period T (10 ns), the carry signal is not generated by the accumulator and the fraction data 5 ns at the output of the accumulator as shown in FIG. 17G is provided at the output of the register 23 in the next clock cycle as in FIG. 17H.

In the second test cycle, the accumulator 22 receives the fraction data 8 ns which is added to the interpolation data 5 ns returned from the register 23. Thus, the accumulated result is 13 ns which exceeds the reference 10 ns period. The accumulator 22 generates a carry signal which is received by the delay circuit 26 through the register 24 in the next clock cycle as in FIG. 17I. Also in the next cycle, the remainder data indicating 3 ns is transferred from the accumulator 22 to the register 23 as in FIG. 17G.

The delay circuit 26 outputs the input signal from the counter 26 with the same timing as the tester rate RA in synchronism with the reference clock Ck. When receiving the carry from the register 24, the delay circuit provides a 10 ns delay to the input signal so that the tester rate RA expanded by 10 ns for the corresponding test cycle.

Thus, as shown in FIG. 17J, in the first test cycle, the time interval is 30 ns while in the second test cycle, the time interval is 40 ns because of the carry from the accumulator 22. The interpolation data RMD is produced at the register 23 as shown in FIG. 17K. As in the example of FIGS. 13–16, the tester rate RA and the interpolation data RMD are supplied to the delay generators $3_1$–$3_3$ to form the required test signals and strobe signals.

FIG. 18 shows another example of circuit configuration for forming a timing generator of the kind of FIG. 10 based on the accumulator and the counter. The timing data greater than the reference clock period T is provided to a counter 125 while the fraction data smaller than the reference clock period is provided to an accumulator 122. When the fraction data accumulated to the previous data returned from a register 123 is greater than the reference clock period T, for example 10 ns, the accumulator 122 provides a carry to the counter 125.

When receiving the carry, the counter 125 holds the operation for the corresponding reference cycle. The output of the counter 125 is received by a variable delay circuit 137 wherein a delay time defined by the delay data from the register 123 is added to the counter output provided through a coincidence detector 126. The output signal of the variable delay circuit 137 is used as a test signal or a strobe signal as described above.

In the conventional timing generator as described above, however, is not able to generate the same timing signals when the reference clock period is changed. When the reference clock is changed, the data stored in the rate memory or the timing memory has to be changed accordingly through a software process. In other words, in the conventional timing generator, the software is not compatible when the frequency of the reference oscillator is changed. Such a need of frequency change in the reference clock arises, for example, when two or more IC testers having different reference frequencies one another are to be used in a parallel fashion while using the same timing signals.

In the timing generators as shown in FIGS. 10 or 11, since the weight of the data to be supplied to the counters and the accumulators vary with the variation of the reference frequency, it is not possible to generate the same timing signals for the new reference frequency without changing the data in the rate memory or timing memories. Namely, if the reference frequency or period has been changed from Tn to Tm, the rate data and the timing data for the reference period Tm have to be changed from that of the reference period Tn for the ratio determined by Tn/Tm. This means that the software is not compatible in this situation, since the rate data and timing data are determined by the software process.

SUMMARY OF THE INVENTION

It is an object of the present invention to provide a timing generator which is capable of generating the same timing signals even when the reference clock frequency is changed without changing the data in the data memories of the timing generator.

It is another object of the present invention to provide a timing generator which is capable of generating the same timing signals when the reference clock frequency is changed without changing the program for forming the data to be stored in the data memories in the timing generator.

It is a further object of the present invention to provide a timing generator which is capable of providing compensation data to correct the changes derived from the variation of the reference clock frequency.

It is a further object of the present invention to provide a timing generator which is capable of generating the same timing signals among a plurality of IC testers having different reference clock signals.

In the present invention, the timing generator compensates the difference between the reference clock frequencies by converting the base number for generating the timing signals corresponding to the ratio of reference clock frequencies without changing the timing data provided by the software process.

The timing generator of the present invention includes: a data memory for dynamically receiving the timing data through the software process to define the time length of the timing signals wherein the timing data is formed of data which is a quotient produced by a division of the time length by a time period of a reference clock signal and fraction data which is a remainder of said division and is smaller than the time period of the reference clock signal; a counter for counting the number of pulses of a reference clock signal and generating an output signal when the number of counts of the pulse coincides with the quotient from the data memory; an accumulator for accumulating the fraction data with the fraction data of previous cycle of the reference clock signal and generating a carry signal when the accumulated value exceeds the time period of the reference clock signal; a number converter which converts the timing data provided through the software process based on a first reference clock period Tn by a ratio of the first reference clock period Tn and a second clock period Tm; and means for providing a complementary number -Tm of the second reference clock period Tm to the accumulator.

In the further aspect of the present invention, the timing generator includes; a data memory for dynamically receiving the timing data through the software process to determine the time length of the timing signals wherein the timing data is formed of data which is a quotient produced by a division of the time length by a time period of a reference clock signal and fraction data which is a remainder of the division and is smaller than the time period of the reference clock signal; a counter for counting the number of pulses of a reference clock signal and generating an output signal when the number of counts of the pulse coincides with the quotient from the data memory; an accumulator for accumulating the fraction data with the fraction data of previous cycle of the reference clock signal and generating a carry when the accumulated value exceeds the time period of the reference clock signal wherein the accumulator includes a difference accumulator which accumulates a time difference between a first reference clock period and a second reference clock period for each clock cycle of the second reference clock, and a phase accumulator which accumulates fraction data from the difference accumulator which is smaller than the first reference time period; wherein the counter additionally counts by one count when receiving a carry signal from the difference accumulator and holds its counting when receiving a carry signal from the phase accumulator.

According to the present invention, the timing generator can generate the same timing signals even when the reference clock frequency is changed, without changing the data prepared by the software for the data memories of the timing generator. Accordingly, the timing generator of the present invention can generate the same timing signal even when the reference clock frequency is changed without changing the program for forming the data to be stored in the memories in the timing generator.

BRIEF DESCRIPTION OF THE DRAWINGS

FIGS. 3A–3I are timing chart showing an operation of the timing generator of the present invention when the reference clock frequency is changed to f'.

FIGS. 5A–5I are timing chart showing an operation of the difference accumulator 51 which is used in the embodiment of FIG. 4.

FIGS. 6A–6D are timing chart showing an operation of the phase accumulator 52 which is used in the embodiment of FIG. 4.

FIGS. 9A–9K are timing charts showing an operation of the timing generator in accordance with the second embodiment of the present invention.

FIGS. 11A–11C are timing chart showing an example of timing relationship between the test signals and strobe signal to explain the operation of the timing generator of FIG. 10.

FIG. 12 is a diagram showing the data to be stored in the rate memories and timing memories in the timing generator of FIG. 10.

FIGS. 13A–13D are timing chart showing an operation of the rate generator in the timing generator of FIG. 10 for generating the timing signals of FIG. 11.

FIGS. 14A–14E are timing chart showing an operation of the first delay generator in the timing generator of FIG. 10 for generating the test signal CLK1 of FIG. 11.

FIGS. 15A–15E are timing chart showing an operation of the second delay generator in the timing generator of FIG. 10 for generating the test signal CLK2 of FIG. 11.

FIGS. 16A–16E are timing chart showing an operation of the third delay generator in the timing generator of FIG. 10 for generating the strobe signal STRB of FIG. 11.

FIGS. 17A–17K are timing chart showing a more detailed operation of the rate generator in the timing generator of FIG. 10 for generating the timing signals of FIG. 11.

FIGS. 19A–19K are timing chart showing the effects of the present invention for generating the timing signal of FIG. 11A when the reference clock frequency is changed from fn to fm without changing the data in the software.

DETAILED DESCRIPTION OF THE PREFERRED EMBODIMENT

Figure 1:
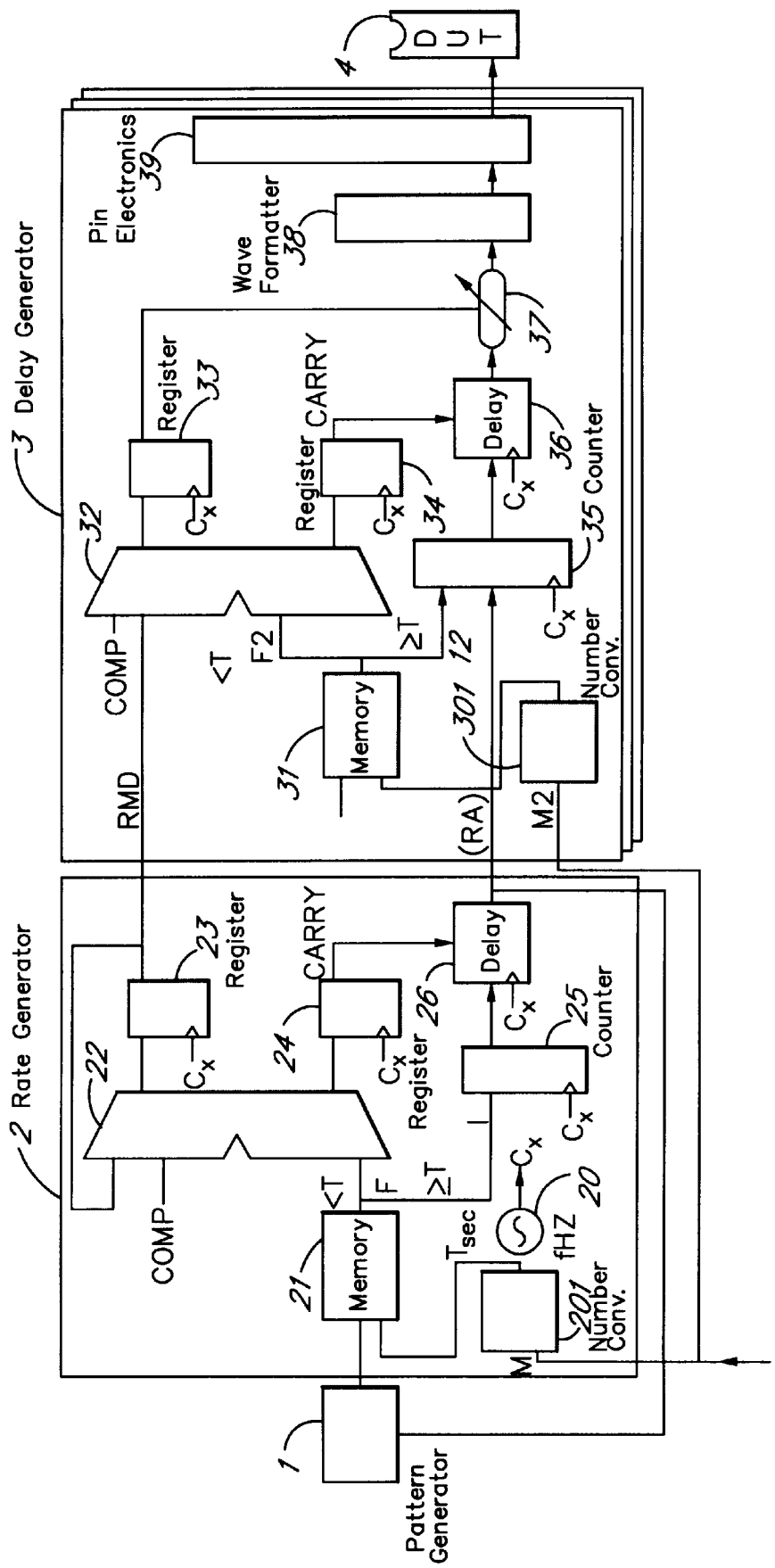
FIG. 1 is a block diagram showing a first embodiment of timing generator for plural reference clock oscillators in accordance with the present invention.

FIG. 1 is a block diagram showing a first embodiment of timing generator for plural reference clock oscillators in accordance with the present invention. In FIG. 1, the timing generator is generally formed of a rate generator 2 and a plurality of delay generators 3. A pattern generator 1 provides address data to the rate generator to specify timings for each test pattern cycle. Although not shown, the pattern generator 1 also generates pattern data to specify a type of test signal and expected data to compare with resulting output signals from the device under test.

The rate generator 2 provides a tester rate RA and interpolation data RMD to the delay generators 3. Each of the delay generators 3 provides a delay time defined by the interpolation data RMD to the tester rate RA from the rate generator 2. The test signal whose timing is thus determined by the delay generator 3 is wave shaped by a wave formatter 38 and is applied to a semiconductor device 4 through a pin electronics 39 which interfaces the IC tester with each pin of the device 4. In an actual IC tester, a large number of delay generators 3 are prepared corresponding to input pins of a semiconductor device to be tested.

Figure 10:
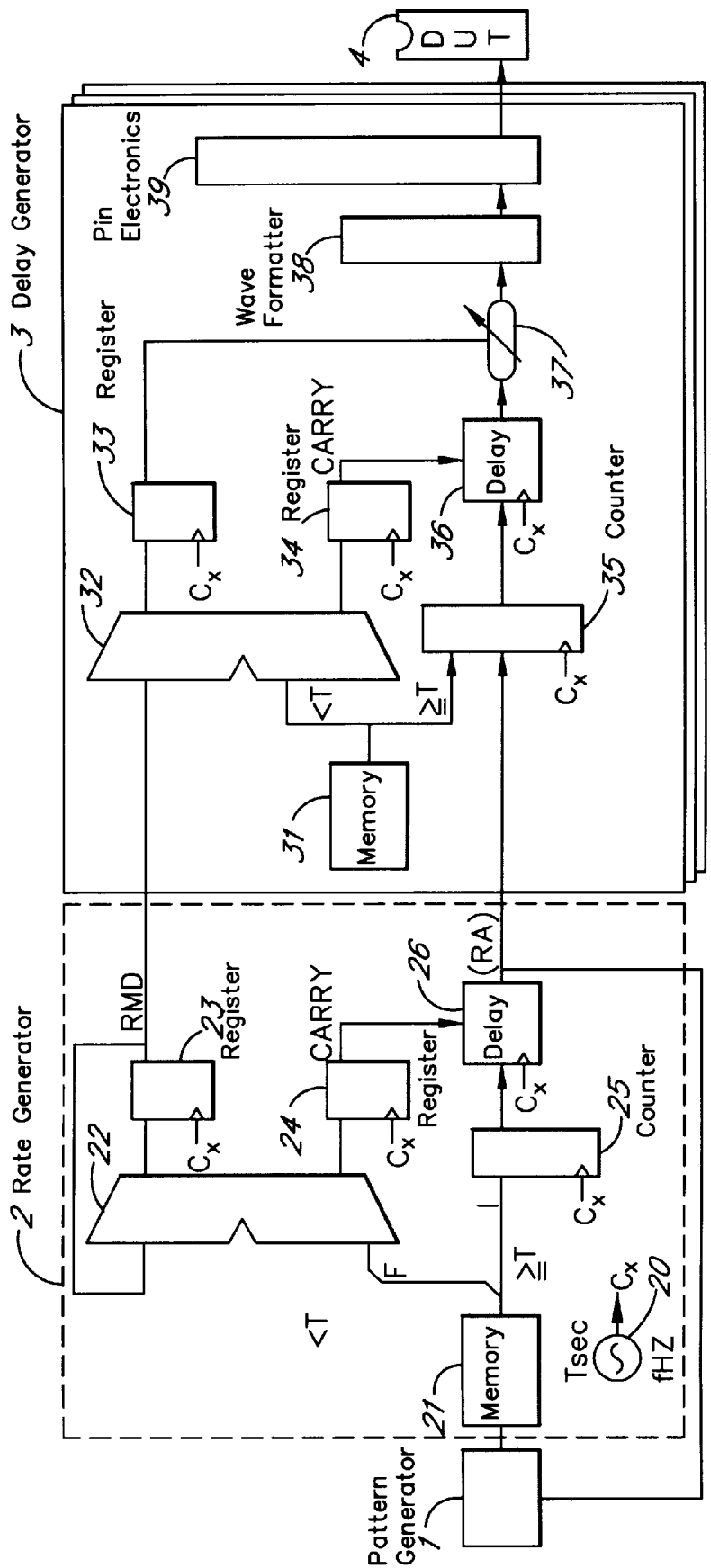
FIG. 10 is a block diagram showing a circuit configuration of conventional timing generator having a combination of accumulators and counters.
Figure 17G:
Figure 17H:
Figure 17I:
Figure 17J:
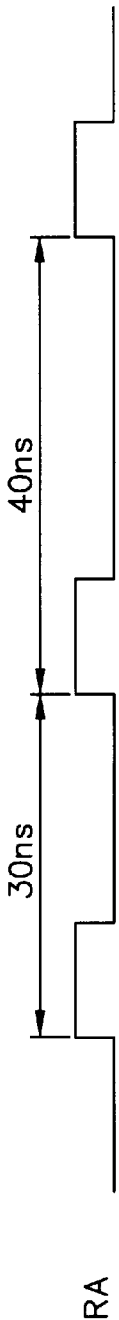
Figure 17K:
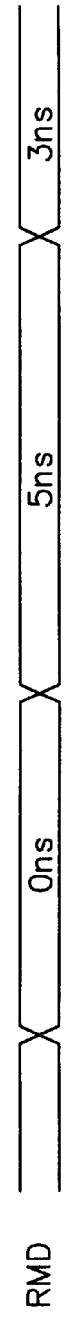
Figure 18:
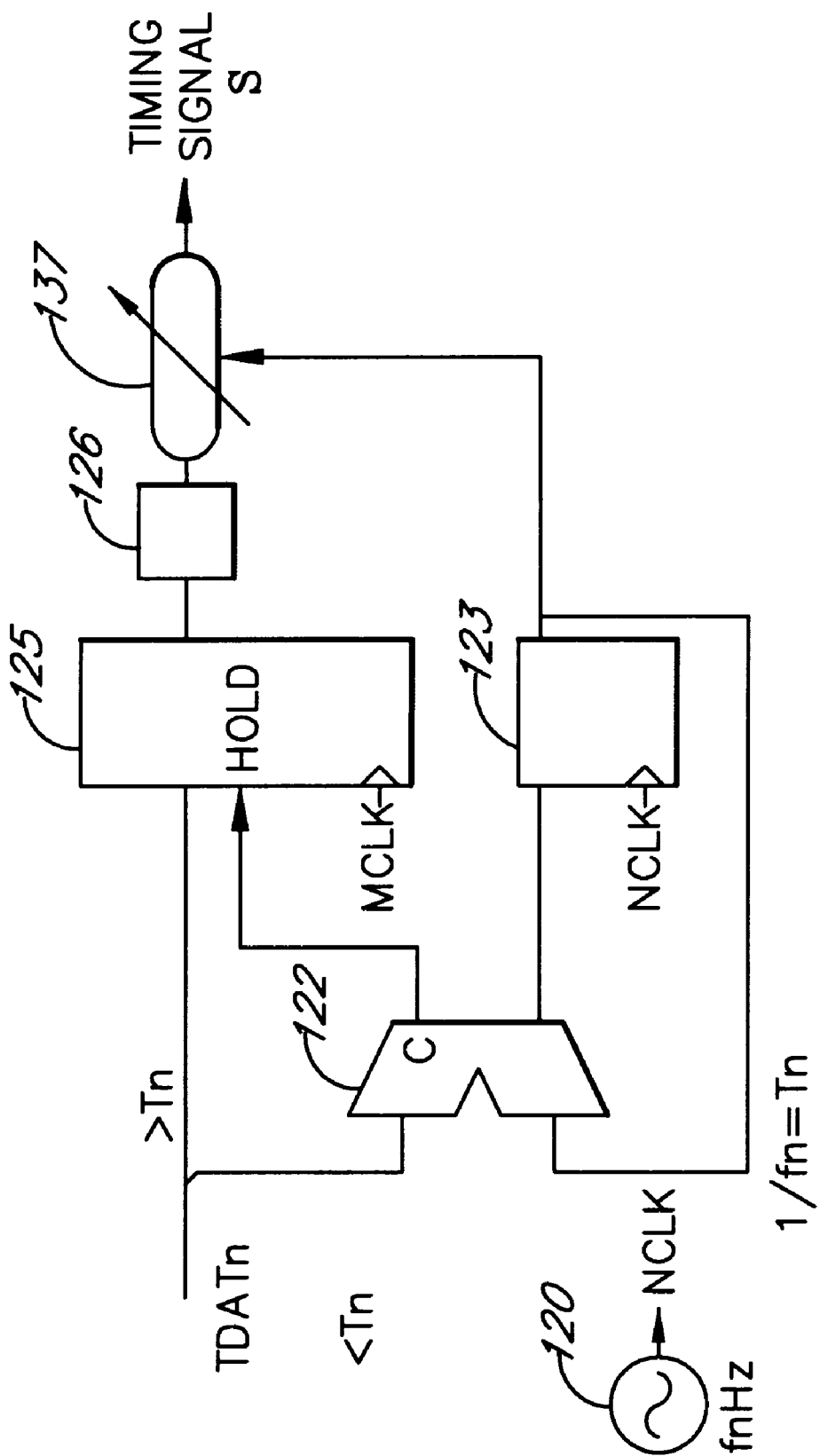
FIG. 18 is a block diagram showing another example of conventional timing generator having a combination of accumulators and counters.

The rate generator 2 of FIG. 1 includes a reference oscillator 20, a rate memory 21, an accumulator 22, registers 23 and 24, a counter 25, and a delay circuit 26 as in the conventional timing generator of FIG. 10. In the present invention, the rate generator further includes a number converter 201 for storing base number data indicating the new reference clock period and converting the rate data M based on the base number. The rate data M is converted by the base number data at the number converter 201 and is provided to the rate memory 21. Further, a compensation signal COMP is provided to an input terminal of the accumulator 22.

Each of the delay generators 3 of FIG. 1 includes a timing memory 31, an accumulator 32, registers 33 and 34, a counter 35, a delay circuit 36 and a variable delay circuit 37 as in the conventional timing generator of FIG. 10. Similar to the rate generator 2, in the present invention, the delay generator 3 further includes a number converter 301 for storing base number data indicating the new reference clock period and converting the timing data M2 on the basis of the base number. The timing data M2 is converted by the base number data at the number converter 301 and is provided to the timing memory 31. Further, a compensation signal COMP is provided to an input terminal additionally provided to the accumulator 32.

The reference clock Ck is given to these circuit elements of the delay generator 3 to synchronizes operations in the IC tester. The timing memory 31 stores timing data to determine, in combination with the interpolation data RMD from the rate generator 2, the timings such as the test signals for the IC device under test or the strobe signals to sample the resulting signals from the device under test for each test cycle.

In the timing generator of FIG. 1, when the reference frequency is changed from fn to fm, the base number data indicating Tm=1/fm is set in the registers 201 and 301, respectively. Further, data indicating -Tm which is a complimentary number of Tm is provided to the inputs of the accumulators 22 and 32 as the compensation signal COMP.

When the rate data M is given through the software process to the rate memory 21 in the rate generator 2, the rate data M is divided by the base number Tm, i.e., M/Tm, in the number converter 201. Thus, the rate memory 21 stores the quotient Im and the remainder Fm resulted from the division. Under this setting, although the counter 25 counts the reference clock having the time period Tm, the data Im received by the counter 25 and the data Fm received by the accumulator 22 are converted based on the period Tm. Thus, a carry signal from the accumulator 22 is generated when the accumulated value exceeds the time period Tm rather than Tn, which can compensate the change in the reference clock frequency from fn to fm.

Similarly, when the timing data M2 is given through the software process to the timing memory 31 in the delay generator 3, the timing data M2 is divided by the base number Tm, i.e., M2/Tm, in the number converter 301. Thus, the timing memory 31 stores the quotient Im and the remainder Fm resulted from the division. Under this setting, although the counter 35 counts the reference clock having the time period Tm, the data I2m received by the counter 35 and the data F2m received by the accumulator 32 are converted based on the period Tm. Thus, a carry signal from the accumulator 32 is generated when the accumulated value exceeds the time period Tm rather than Tn, which compensates the change in the reference clock frequency from fn to fm.

The effects of the present invention is illustrated in timing charts of FIGS. 19A–19K which are a case where the present invention is employed for the rate generator 2. In the example of FIG. 19, it is shown the effect of the present invention wherein the test signal CLK1 of FIG. 11A is generated when the reference clock period is changed from 10 ns to 12 ns. The clock rate in FIG. 19A is 12 ns rather than 10 ns in the examples of FIGS. 13–17. One of the features of the present invention is to generate the same timing signals without changing the software for determining the timings.

In FIG. 19B, the rate data M for the rate memory 21 provided through the software process is, 35 ns, 38 ns and 30 ns, which is the same as shown in FIGS. 12. The data M is divided by 12 ns in the number converter 201 as described above, thus, the data I (quotient resulted by the division) for the rate memory 21 is 2, 3, 3, respectively, for the first three test cycle as shown in FIG. 19C. The data I is provided to the counter 25 so that the counter 25 operates as in FIG. 19D in counting the reference clock and generates an output as shown in FIG. 19E.

The fraction data in this situation is 11 ns for the first cycle (35 ns–24 ns), 2 ns for the second cycle (38 ns–36 ns) and 6 ns for the third cycle (30 ns–24 ns) as in FIG. 19F. Thus, the output of the accumulator 22 is 11 ns, 13 ns, and 7 ns as shown in FIG. 19G where the carry is generated for the second cycle at the output of the register 24 at the following clock cycle. The output of the register 23 is shown in FIG. 19H which is the fraction of the accumulator output.

Thus, the rate generator produces the tester rate RA of FIG. 19J and the interpolation data of FIG. 19K which are processed by the similar timing chart of FIG. 14. Based on the tester rate RA and the interpolation data RMD from the rate generator, the delay generator having the timing data 0 ns, 0 ns, and 0 ns as shown in FIG. 14B can reproduce the same timing signal CLK1 of FIG. 12A.

Figure 2:
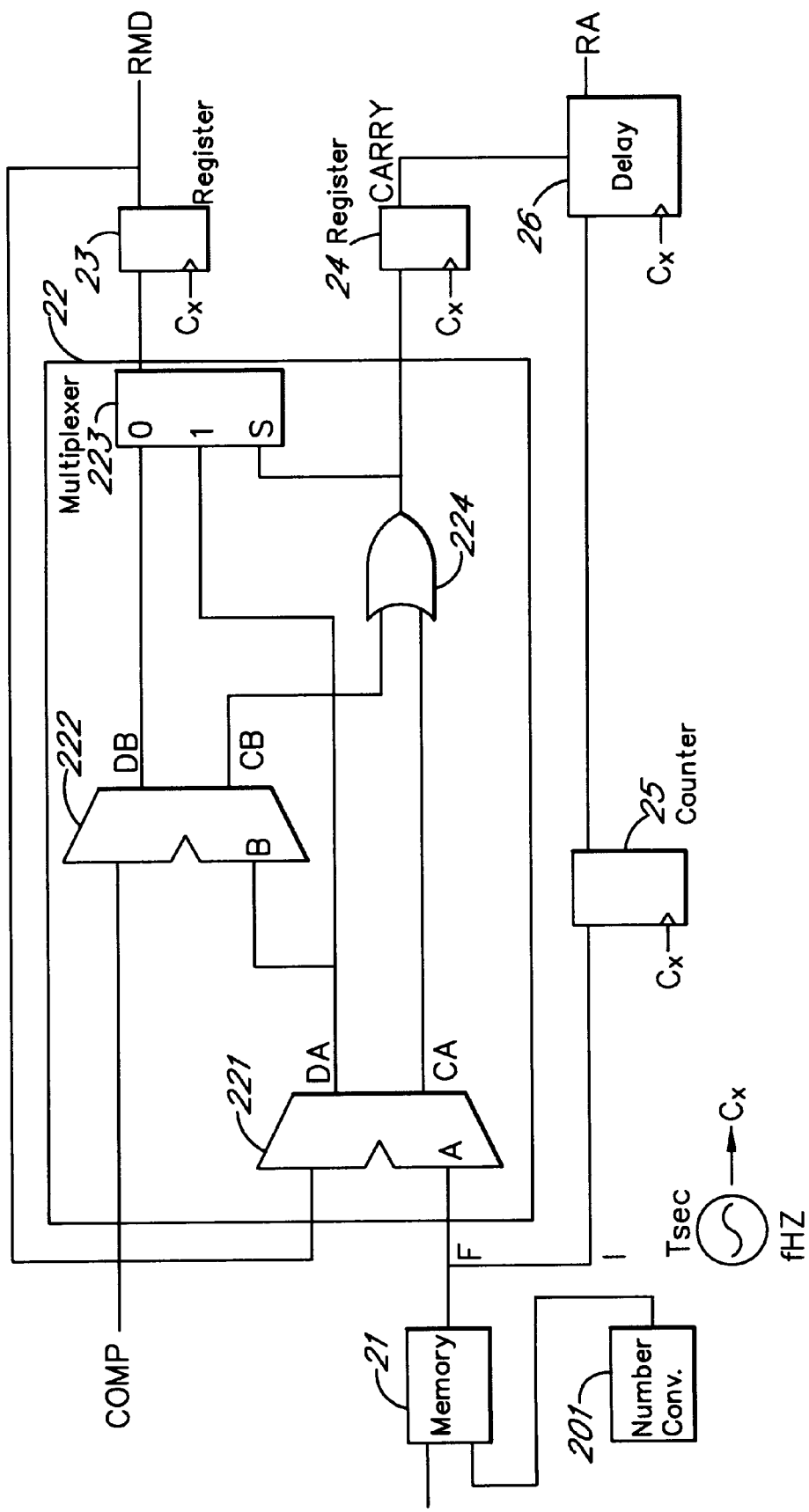
FIG. 2 is a block diagram showing an example of circuit configuration of an accumulator to be used in the timing generator of FIG. 1.

FIG. 2 is an example of circuit configuration of the accumulator 22 to be used in the timing generator of the present invention. In this example, the accumulator 22 includes two stages of accumulators 221 and 222, and a multiplexer 223. An OR gate 224 is provided to receive carry signals from the accumulators 221 and 222. The output of the OR gate is connected to the select terminal of the multiplexer 223 and to the register 24.

In the rate generator shown in FIG. 2, when the frequency of the reference oscillator is fn, the compensation signal COMP is set to "0". The number converter 201 is also set to "0". In the accumulator 221, the interpolation data produced in the previous cycle $RMD_{n-1}$ and the fraction data Fn are accumulated. A carry signal is generated when the accumulated result exceeds the reference clock period Tn. In the accumulator 222, since the signal COMP is "0", the output DB of the accumulator 222 is always the same as the output data DA of the accumulator 221. Unless the carry signal is generated by the accumulator 221, the data DA is selected by the multiplexer 223 which is returned to the accumulator 221 through the register 23.

The above operation is expressed by equations as follows:

$RMD_n = DA_n$ $Carry = CA_n$ $RMD_n = F_n + RMD_{n-1}$

When the frequency of the reference oscillator is changed from fn to fm, the complementary number -Tm is set as a COMP signal and the time period Tm is set in the number converter 201. In the accumulator 221, the interpolation data of the previous cycle $RMD_{n-1}$ is added to the fraction data Fm. When the sum of the data exceeds the time period Tn, a carry is produced at the output CA of the accumulator 221. In the accumulator 222, the accumulated data DA from the accumulator 221 is added to the complementary number -Tm. When the sum of the data exceeds the time period Tm, a carry is produced at the output CB of the accumulator 222.

When the carry $CA_n$ or $CB_n$ are generated by either the accumulators 221 or 222, the multiplexer 223 selects the data DB from the accumulator 222. When the carry signal is not generated, the multiplexer 223 selects the data DA from the accumulator 221 which is the interpolation data RMD at the output of the register 23.

The foregoing operation is expressed by equations as follows:

$RMD_n = (CA_n + CB_n) \times DB_n + (*CA_n + *CB_n) \times DA_n$ $Carry = CA_n + CB_n$ where * indicates an inverted signal.
The above operation also satisfy the following relationship:
$RMD_n = F_m + RMD_{n-1} - Tm$ (for $F_m + RMD_{n-1} \geq Tm$)
$RMD_n = F_m + RMD_{n-1} - Tm$ (for $F_m + RMD_{n-1} < Tm$)
Carry is generated when $F_m + RMD_{n-1} \geq Tm$
Because of the foregoing relationship, there is no need to change the data provided to the memories in the timing generator through the software process.

FIGS. 3A–3I are timing chart showing the operation of the present invention of FIG. 2 when the frequency of the reference oscillator is changed from f to f'. The reference clock Ck in FIG. 3I is provided to the circuit components of FIG. 2. The carry CA in FIG. 3B from the accumulator 221 is generated when the accumulated value exceeds the time period T (=1/f) while the carry CB in FIG. 3C from the accumulator 222 is generated when the accumulated value exceeds the time period T' (=1/f').

When no carry signals are generated from the accumulators 221 or 222, the accumulated data DA in FIG. 3A from the accumulator 221 is the interpolation data RMD in FIG. 3H for the delay generator 3 and the output of the counter 25 in FIG. 3F becomes the tester rate RA in FIG. 3G. When the carry signal is generated either by the accumulators 221 or 222, the difference of the DA and period T' becomes the interpolation data RMD and the output of the counter 25 is delayed by one clock cycle T' by the delay circuit 26 as the tester rate RA.

Figure 4:
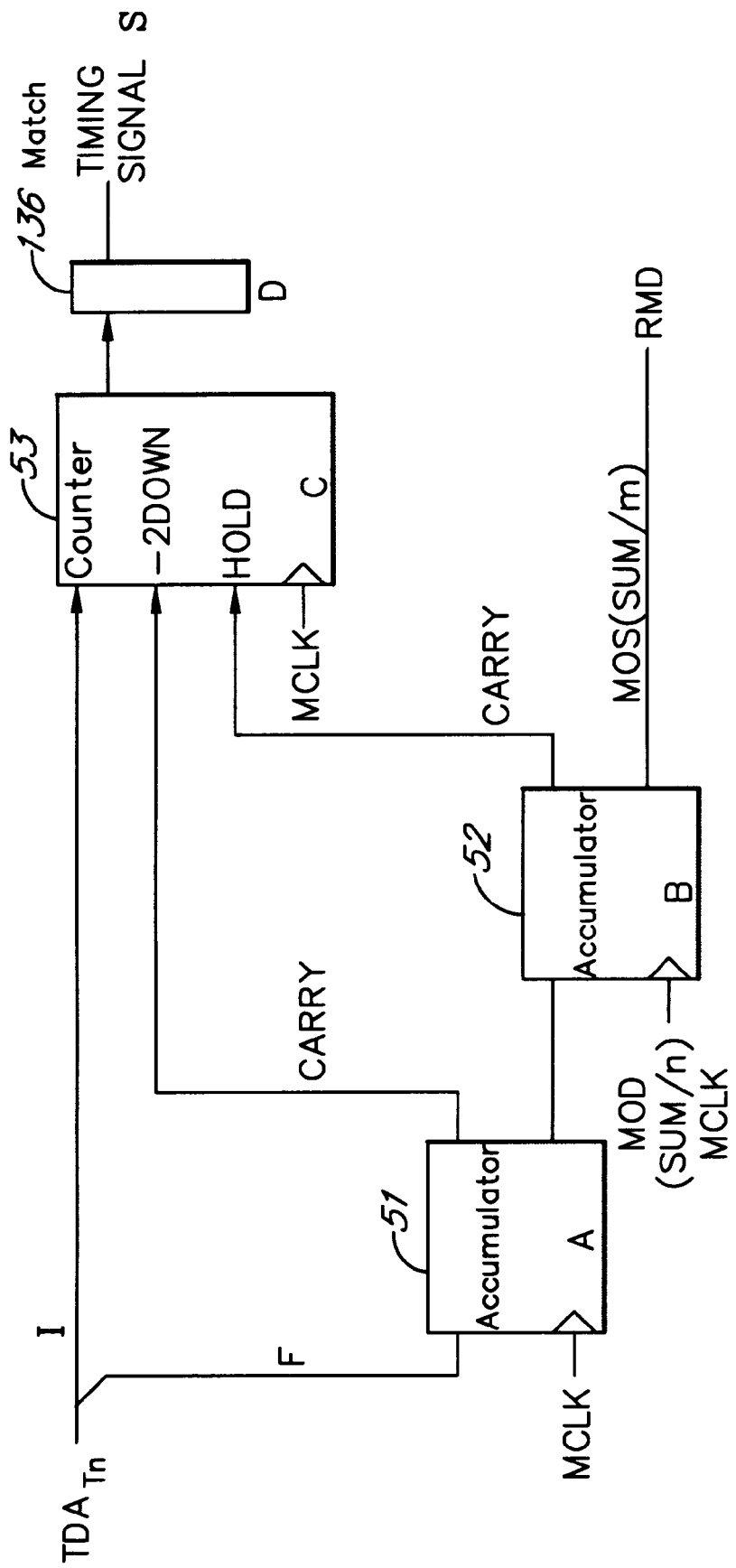
FIG. 4 is a block diagram showing a second embodiment of timing generator for plural reference clock oscillators in accordance with the present invention.

FIG. 4 is a block diagram showing a second embodiment of the timing generator in accordance with the present invention. In FIG. 4, a difference accumulator 51 is provided for accumulating the difference between the first reference clock and the second reference clock. Further, a phase accumulator 52 is provided to accumulate the output from the difference accumulator 51. A counter 53 is controlled by the results of the accumulation both from the accumulators 51 and 52.

FIG. 4 shows a situation where the timing generator of the present invention is to generate the timing signals based on the reference frequency fm (period Tm) using the same data provided for the reference frequency fn (period Tn). In the example of FIG. 4, the reference clock period (base number) Tn is smaller than the reference clock period (base number) Tm, although the similar circuit configuration can accomplish the same result under the conditions where the base number Tn is equal to or greater than the base number Tm.

For the timing data $TDA_{T_n}$ from the software, a part of the data I which is greater than the time period Tn is sent to the counter 53 while the fraction data F which is smaller than the time period Tn is sent to the difference accumulator 51. The difference accumulator 51 accumulates the difference between the reference clock periods Tn and Tm.

When the accumulated value d by the difference accumulator 51 is greater than the fraction data F, i.e., the fraction data F minus accumulated value d is smaller than zero, the difference accumulator 51 generates a carry (borrow) signal based on the time period Tn to count down the value in the counter 53 by one. Namely, since the counter 53 is a down counter and reduces the value in the counter every time when receiving the reference clock mclk, when the carry signal from the difference accumulator 51 is received, the counter 53 counts down by two rather than by one to compensate the change of reference frequency.

FIGS. 5A–5I are timing chart showing an operation of the difference accumulator 51 of FIG. 4. As in the situation of FIG. 4, in FIG. 5, it is intended that the timing generator of the present invention is to generate the timing signals based on the reference frequency fm (period Tn) using the same data provided for the reference frequency fn (period Tm). In the example of FIG. 5, the timing data $TDA_{T_n}$ in FIG. 5A includes the data I(n) which is the quotient by the division TDA/Tn and the fraction data F(n) which is the remainder of the division. Thus, the tester rate for the reference clock Tn is shown in FIG. 5B.

The reference clock with the time period Tn is shown in FIG. 5C while the reference clock with the time period Tm is shown in FIG. 5E. The difference between the reference clock periods Tn and Tm is accumulated for each clock cycle in the manner shown in FIG. 5D by the difference accumulator 51. FIGS. 5H and 5I show a timing of the tester rate based on the data $TDA_{T_m}$ without compensation while the FIGS. 5F and 5G show a timing of the tester rate based on the $TDA_{T_m}$ with compensation by the circuit of FIG. 4. As shown in FIG. 5G, the tester rate generated by the circuit of FIG. 4 is the same as the tester rate of FIG. 5B.

The example of timing data in FIG. 5 is expressed by the equation as follows:

$$I(n)+F(n)=Tn \times 4+F(n)$$

If the reference clock period Tm is used without compensation, timing signals different from the purpose will be produced. Thus, the difference d between the reference clock periods Tn and Tm is compensated for every clock cycle in the following steps.

(1) $F(n)-d \geq 0$ (2) $F(n)-d-d \geq 0$ (3) $F(n)-d-d-d < 0$ (4) The counter 53 is additionally counted down by one in the step (3) when receiving the carry signal from the difference accumulator 51 and thus finished counting.

Under this relationship, the timing difference between the reference clock periods Tn and Tm is compensated to produce the same tester rate as shown in FIGS. 5B and 5G. This can be also explained by the following mathematical relationship:

$$TDA_{T_m} \times Tm = TDA_{T_n} \times Tn$$
$$= TDA_{T_n} \times (Tm - d)$$
$$= TDA_{T_n} \times Tm - TDA_{T_n} \times d.$$

Figures 6B, 6C, 6D:
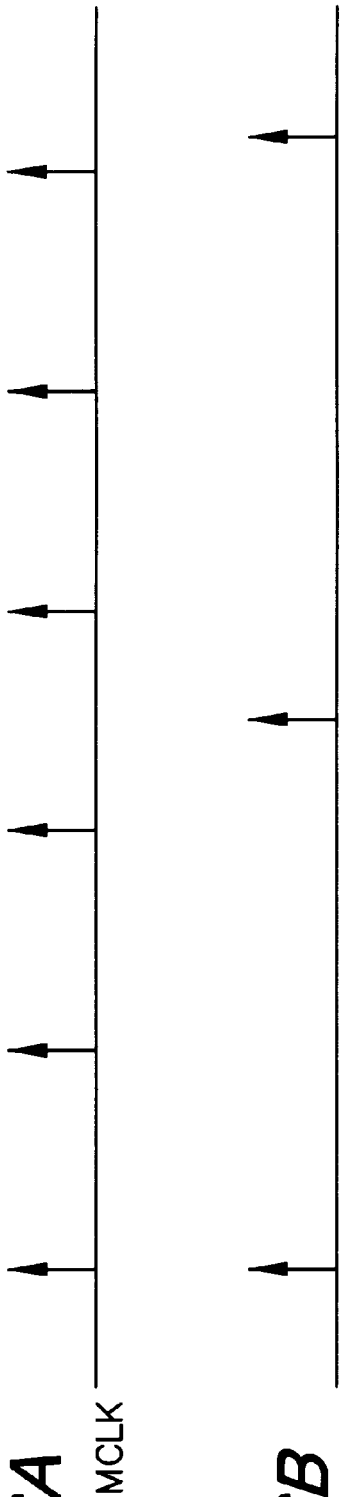

The operation of the phase accumulator 52 in FIG. 4 will be explained with reference to the timing chart of FIGS. 6A–6D. The phase accumulator 52 accumulates the fraction data F(m) produced by the accumulator 51 to produce the interpolation data P(m). FIG. 6A shows the reference clock mclk and FIG. 6B shows the timing signal to be generated. FIGS. 6C and 6D show the interpolation data $P(m)_1$ for the first test cycle and $P(m)_2$ for the second test cycle. The interpolation data P(m) is fraction data having the value less than the reference clock period Tm.

In the phase accumulator 52, every time when the accumulated fraction data exceeds the time period Tm, a carry signal is generated which is provided to the counter 53. In receiving the carry signal from the phase accumulator 52, the counter 53 holds its counting operation for one clock cycle, which delays the output of the counter by Tm.

The output signal from the counter 53 and through the coincidence circuit 136 is used as a timing signal S of FIG. 6B. The output of the phase accumulator 52 is used as the interpolation data RMD. The timing signal S (tester rate RA) and the interpolation data RMD may be further processed by the delay generators 3 in FIG. 1. As in the foregoing, the timing generator of the present invention can generate timing signals identical to that generated under the reference clock period Tn even when the reference clock period is changed from Tn to Tm.

Figure 7A:
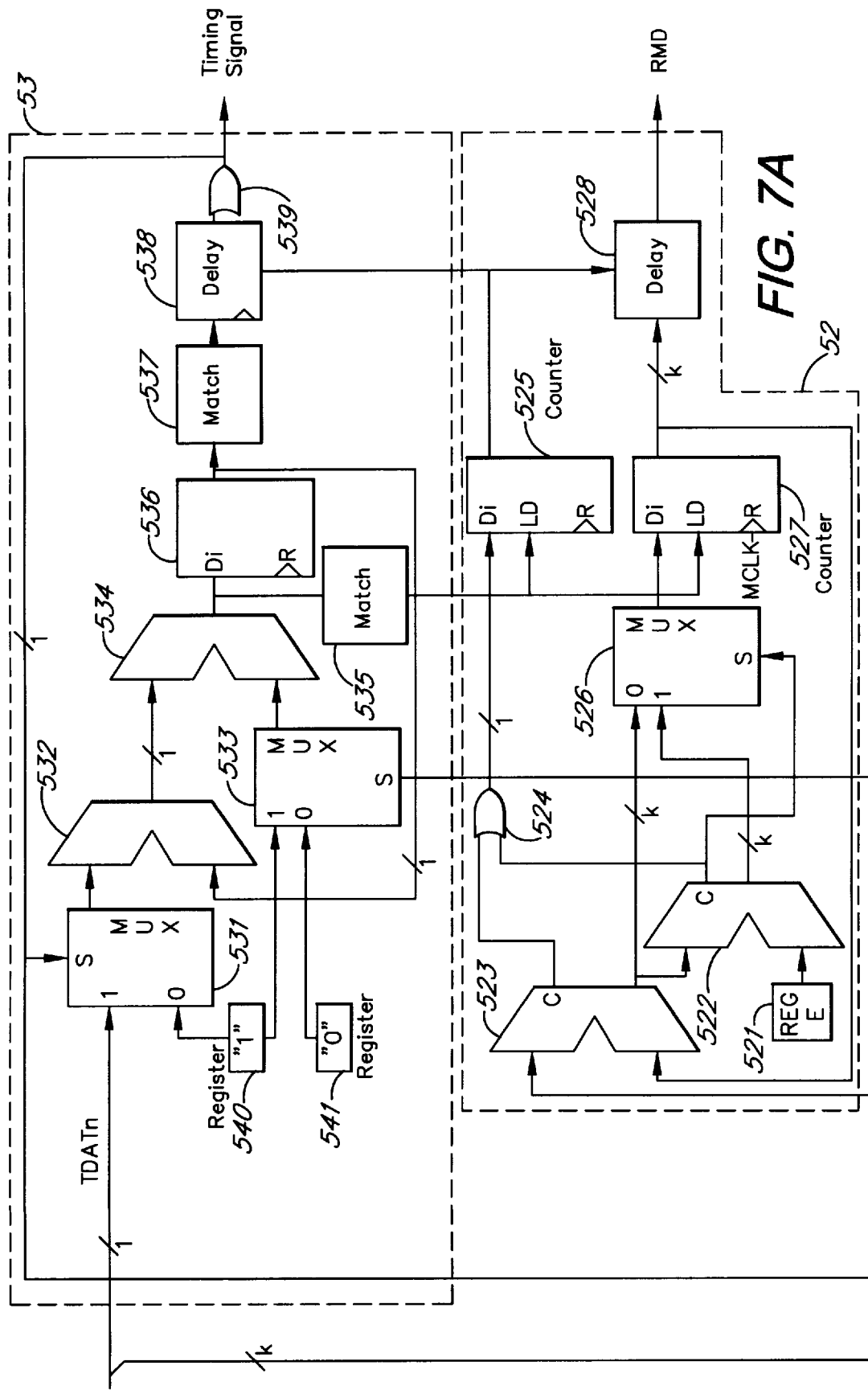
FIG. 7 is a block diagram showing a modification of the second embodiment of the timing generator of FIG. 4 where the counter 53 is formed of a down counter.
Figure 8:
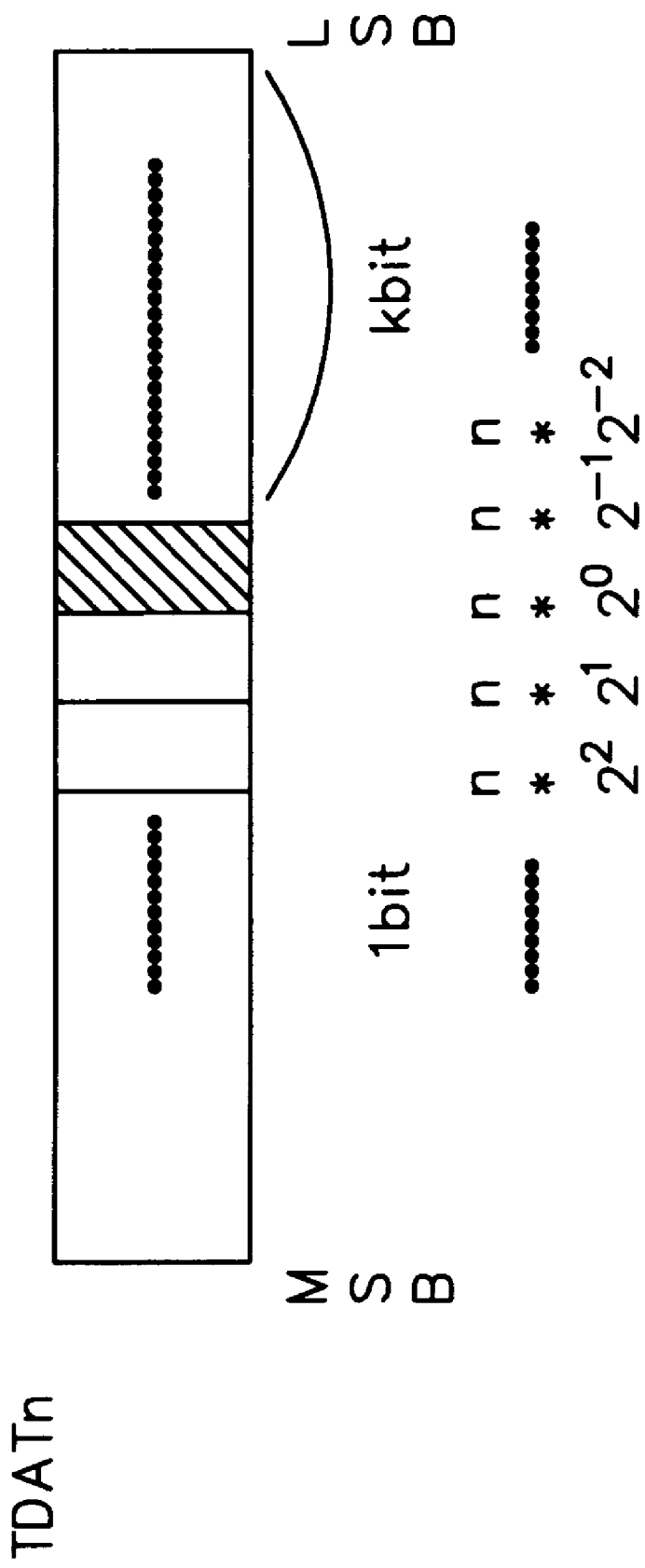
FIG. 8 is a schematic diagram showing a bit structure of timing data to be supplied to the data memories.

FIG. 7 shows a more detailed circuit diagram of the accumulators 51–52 and the counter 53 of FIG. 4. The timing data $TDA_{T_n}$ for the reference time period Tn is expressed by a bit structure of FIG. 8. The upper set of bits (L) is supplied to the counter 53 while the lower set of bits (K) is supplied to the difference accumulator 51.

In a register 511 in the difference accumulator 51, it is provided with a value –d which is a complementary of the value d which is the difference of time periods Tn and Tm. In a register 521 in the phase accumulator 52, it is provided with a value -Tm which is a complementary of the reference clock period Tm.

FIGS. 9A–9K are timing chart showing the operation of the second embodiment of FIGS. 4–8 to generate the timing signal using the reference clock period Tm and the timing data under the reference clock period Tn. A start signal is provided by the timing signal S. The timing data $TDA_{T_n}$ is formed of the data I(n) which is a quotient of division TDA/Tn and the fraction data F(n) which is a remainder of the division. The data I(n) in this case is 4 while the fraction data F(n) is 2d where d is time difference between the reference clock periods Tn and Tm. The timing signal of FIG. 9K is generated by the reference clock period Tm, which has the same timing as the timing signal of FIG. 9B which is generated by the reference clock period Tn.

As has been described above, according to the present invention, the timing generator can generate the same timing signals even when the reference clock frequency is changed, without changing the timing data prepared by the software for the data memories of the timing generator. Accordingly, the timing generator of the present invention can generate the same timing signal even when the reference clock frequency is changed without changing the program for forming the data to be stored in the memories in the timing generator.

What is claimed is:

1. A timing generator for generating timing signals based on timing data produced by a software process for testing IC devices by an IC tester, comprising:

a data memory for dynamically receiving the timing data through said software process which defines time lengths of said timing signals relative to timing signals in a previous cycle of operation in said IC tester, said timing data being formed of data which is a quotient produced by a division of said time length by a time period of a reference clock signal and fraction data which is a remainder of said division and is smaller than said time period of said reference clock signal;

a counter for counting the number of pulses of said reference clock signal and generating an output signal which represents a delay time expressed by said quotient and is delayed by an integer multiple of said time period of said reference clock signal from a previous output signal when the number of counts of said pulses coincides with said quotient from said data memory;

an accumulator for accumulating said fraction data from said data memory and said fraction data of said previous cycle and generating a carry when the accumulated value exceeds said time period of said reference clock signal, said carry being provided to a cycle delay circuit for delaying said output signal of said counter by one clock cycle of said reference clock signal;

a number converter which converts said timing data provided to said data memory through said software process based on a ratio of a first reference clock period Tn and a second reference clock period Tm so that said quotient and said remainder in said data memory are defined on the basis of said second reference clock period Tm; and a means for providing a complementary number -Tm of said second reference clock period Tm to said accumulator for producing a time difference data between said second reference clock period Tm and said accumulated value as fraction data for the next cycle.

2. A timing generator as defined in claim 1, wherein said accumulator includes:

a first accumulator which receives said fraction data from said data memory and output data produced by said first accumulator in said previous cycle and accumulates said fraction data and said output data;

a second accumulator which receives output data from said first accumulator and said complementary number -Tm of said second reference time period Tm and accumulates said output data and said complementary number -Tm to produce said time difference data between said second reference clock period Tm and said accumulated value;

an OR gate which is provided with carry signals from said first accumulator and said second accumulator; and a multiplexer which selects either one of output data of said first accumulator or output data of said second accumulator based on a signal from said OR gate.

3. A timing generator as defined in claim 1, wherein said timing generator is formed of a rate generator to generate a tester rate signal and interpolation data, and a delay generator which is connected to said rate generator to generate a timing signal based on said timing data provided in said data memory, said tester rate signal and said interpolation data from said rate generator.

4. A timing generator for generating timing signals based on timing data produced by a software process for testing IC devices by an IC tester, comprising:

a data memory for dynamically receiving the timing data through said software process which defines the time lengths of said timing signals relative to timing signals in a previous cycle of operation in said IC tester, said timing data being formed of data which is a quotient produced by a division of said time length by a time period of a reference clock signal and fraction data which is a remainder of said division and is smaller than said time period of said reference clock signal;

a counter for counting the number of pulses of said reference clock signal and generating an output signal which is delayed by a delay time represented by said quotient which is an integer multiple of said time period of said reference clock signal from a previous output signal when the number of counts of said pulses coincides said quotient in said data memory;

an accumulator for accumulating said fraction data from said data memory and fraction data of said previous cycle and generating a carry when the accumulated value exceeds said time period of said reference clock signal, said carry being provided to a cycle delay circuit for delaying said output signal of said counter by one clock cycle of said reference clock signal, said accumulator including a difference accumulator which accumulates a time difference between a first reference clock period and a second reference clock period for each clock cycle of a second reference clock signal, and a phase accumulator which accumulates fraction data generated by said difference accumulator which is smaller than said first reference time period;

wherein said counter additionally counts by one count when receiving a carry signal from said difference accumulator and suspends a counting operation by one clock cycle when receiving a carry signal from said phase accumulator.

5. A timing generator as defined in claim 4, wherein said timing generator is formed of a rate generator to generate a tester rate signal and interpolation data, and a delay generator which is connected to said rate generator to generate a timing signal based on said timing data provided in said data memory, said tester rate signal and said interpolation data from said rate generator.

* * * * *